(12) United States Patent
Lim et al.

(10) Patent No.: US 9,230,922 B2
(45) Date of Patent: Jan. 5, 2016

(54) PRECURSOR COMPOSITION FOR DEPOSITION OF SILICON DIOXIDE FILM AND METHOD FOR FABRICATING SEMICONDUCTOR DEVICE USING THE SAME

(71) Applicant: SAMSUNG ELECTRONICS CO., LTD., Suwon-si, Gyeonggi-do (KR)

(72) Inventors: Han-Jin Lim, Seoul (KR); Bong-Hyun Kim, Incheon (KR); Seok-Woo Nam, Seongnam-si (KR); Dong-Woon Shin, Seongnam-si (KR); In-Sang Jeon, Seoul (KR); Soo-Jin Hong, Guri-Si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 34 days.

(21) Appl. No.: 14/180,907

(22) Filed: Feb. 14, 2014

(65) Prior Publication Data
US 2014/0264778 A1    Sep. 18, 2014

(30) Foreign Application Priority Data

Mar. 15, 2013    (KR) .................. 10-2013-0028102

(51) Int. Cl.
*H01L 21/31*    (2006.01)
*H01L 23/00*    (2006.01)
(Continued)

(52) U.S. Cl.
CPC ............ *H01L 23/564* (2013.01); *C23C 16/402* (2013.01); *C23C 16/45553* (2013.01); *H01L 21/0228* (2013.01); *H01L 21/02164* (2013.01); *H01L 21/02211* (2013.01); *H01L 21/02271* (2013.01); *H01L 21/02274* (2013.01); *H01L 21/28194* (2013.01); *H01L 29/66545* (2013.01);
(Continued)

(58) Field of Classification Search
CPC .................................................. H01L 21/02164
USPC .................. 257/410; 438/216, 287, 784, 790
See application file for complete search history.

(56) References Cited

U.S. PATENT DOCUMENTS 4,830,890 A * 5/1989 Kanai ..................... 427/255.39
6,136,995 A * 10/2000 Nabika et al. ................ 556/413
(Continued)

FOREIGN PATENT DOCUMENTS

| JP | 07-090589 | 4/1995 |
| KP | 10-2005-0060270 A | 6/2005 |
| KR | 10-2004-0001959 A | 1/2004 |

*Primary Examiner* — George Fourson, III
(74) *Attorney, Agent, or Firm* — Lee & Morse, P.C.

(57) ABSTRACT

A precursor composition for forming a silicon dioxide film on a substrate, the precursor composition including at least one precursor compound represented by the following chemical formulas (1), (2), and (3):

$$H_xSiA_y(NR^1R^2)_{4-x-y} \quad (1)$$

$$H_xSi(NAR^3)_{4-x} \quad (2)$$

$$H_xSi(R^4)_z(R^5)_{4-x-z} \quad (3)$$

wherein, independently in the chemical formulas (1), (2), and (3), H is hydrogen, x is 0 to 3, Si is silicon, A is a halogen, y is 1 to 4, N is nitrogen, and $R^1$, $R^2$, $R^3$, and $R^5$ are each independently selected from the group of H, aryl, perhaloaryl, $C_{1-8}$ alkyl, and $C_{1-8}$ perhaloalkyl, and $R^4$ is aryl in which at least one hydrogen is replaced with a halogen or $C_{1-8}$ alkyl in which at least one hydrogen is replaced with a halogen.

17 Claims, 14 Drawing Sheets

(51) Int. Cl.

| | |
|---|---|
| *H01L 21/28* | (2006.01) |
| *H01L 29/66* | (2006.01) |
| *H01L 29/78* | (2006.01) |
| *H01L 21/02* | (2006.01) |
| *C23C 16/40* | (2006.01) |
| *C23C 16/455* | (2006.01) |
| *H01L 29/51* | (2006.01) |
| *H01L 29/165* | (2006.01) |

(52) U.S. Cl.
CPC ...... *H01L 29/66636* (2013.01); *H01L 29/7848* (2013.01); *H01L 23/562* (2013.01); *H01L 29/165* (2013.01); *H01L 29/513* (2013.01); *H01L 29/517* (2013.01); *H01L 2924/0002* (2013.01)

(56) References Cited

U.S. PATENT DOCUMENTS

| | | | |
|---|---|---|---|
| 7,084,080 B2 | 8/2006 | Borovik et al. | |
| 7,112,485 B2 | 9/2006 | Vaartstra | |
| 7,439,195 B2 | 10/2008 | Vaartstra et al. | |
| 7,521,331 B2 | 4/2009 | Park et al. | |
| 7,531,679 B2 * | 5/2009 | Wang et al. | 556/412 |
| 2006/0051975 A1 | 3/2006 | Misra et al. | |
| 2006/0178019 A1 * | 8/2006 | Senzaki et al. | 438/788 |
| 2007/0190800 A1 * | 8/2007 | Rantala | 438/758 |
| 2008/0286910 A1 | 11/2008 | Yamazaki et al. | |
| 2010/0233886 A1 * | 9/2010 | Yang et al. | 438/786 |
| 2010/0248465 A1 | 9/2010 | Yi et al. | |
| 2012/0071006 A1 | 3/2012 | Kang | |
| 2013/0344248 A1 * | 12/2013 | Clark | 427/255.393 |
| 2014/0051264 A1 * | 2/2014 | Mallick et al. | 438/786 |

* cited by examiner $$Si_3SiH \rightarrow Si_3Si\cdot + \cdot H$$

PRECURSOR COMPOSITION FOR DEPOSITION OF SILICON DIOXIDE FILM AND METHOD FOR FABRICATING SEMICONDUCTOR DEVICE USING THE SAME

CROSS-REFERENCE TO RELATED APPLICATION

Korean Patent Application No. 10-2013-0028102, filed on Mar. 15, 2013, in the Korean Intellectual Property Office, and entitled: "Precursor Composition For Deposition Of Silicon Dioxide Film and Method For Fabricating Semiconductor Device Using The Same," is incorporated by reference herein in its entirety.

BACKGROUND

1. Field

Embodiments relate to a precursor composition for deposition of a silicon dioxide film and a method for fabricating a semiconductor device using the same.

2. Description of the Related Art

Recently, with the development of electronic technology, down-scaling of semiconductor devices is proceeding rapidly, and the desirability of providing down-scaled semiconductor devices that operate at high speed has increased. Research has been under way to optimize the structure of a transistor to enable semiconductor devices to operate at high speed and to secure reliability.

SUMMARY

Embodiments are directed to a precursor composition for forming a silicon dioxide film on a substrate, the precursor composition including at least one precursor compound represented by the following chemical formulas (1), (2), and (3):

  (1)

  (2)

  (3)

wherein, independently in the chemical formulas (1), (2), and (3), H is hydrogen, x is 0 to 3, Si is silicon, A is a halogen, y is 1 to 4, N is nitrogen, and $R^1$, $R^2$, $R^3$, and $R^5$ are each independently selected from the group of H, aryl, perhaloaryl, $C_{1-8}$ alkyl, and $C_{1-8}$ perhaloalkyl, and $R^4$ is aryl in which at least one hydrogen is replaced with a halogen or $C_{1-8}$ alkyl in which at least one hydrogen is replaced with a halogen.

The precursor composition may include the precursor compound of formula (1) and $R^1$ and $R^2$ may be methyl.

The precursor composition may include the precursor compound of formula (1), and $R^1$ and $R^2$ may be ethyl.

The precursor composition may include the precursor compound of formula (1), and $R^1$ may be methyl and $R^2$ may be ethyl.

The precursor composition may include the precursor compounds of formulas (2) and (3), and $R^3$ and $R^5$ may each independently be methyl or ethyl.

The precursor composition may include the precursor compound of formula (4), and $R^4$ may be $-CH_2Cl$, $-CHClCH_3$, $-CH_2F$, or $-CHFCH_3$.

The precursor composition may include at least one selected from the group of $Si(NMe_2)_3Cl$, $Si(NMeEt)_3Cl$, $Si(NEt_2)_3Cl$, $Si(NEt_2)_2Cl_2$, $Si(NMe_2)_2Cl_2$, and $Si(NMeEt)_2Cl_2$.

Embodiments are also directed to a method for fabricating a semiconductor device, the method including forming a silicon dioxide film on a substrate, and forming a gate electrode on the silicon dioxide film. The silicon dioxide film is formed using a precursor composition for deposition and a reaction gas, the precursor composition for deposition including at least one precursor compound represented the following chemical formulas (1), (2), and (3):

  (1)

  (2)

  (3)

wherein, independently in the chemical formulas (1), (2), and (3), H is hydrogen, x is 0 to 3, Si is silicon, A is halogen, y is 1 to 4, N is nitrogen, and $R^1$, $R^2$, $R^3$, and $R^5$ are each independently selected from the group of H, aryl, perhaloaryl, $C_{1-8}$ alkyl, and $C_{1-8}$ perhaloalkyl, and $R^4$ is aryl in which at least one hydrogen is replaced with a halogen or $C_{1-8}$ alkyl in which at least one hydrogen is replaced with a halogen.

The substrate may include a semiconductor material.

An upper surface of the substrate may include $Si_3SiA$, where A is halogen.

Forming the silicon dioxide film may include forming the silicon dioxide film using ALD (Atomic Layer Deposition) or CVD (Chemical Vapor Deposition).

The reaction gas may include at least one of $O_3$ gas, $O_2$ gas, $O_3$ plasma, and $O_2$ plasma.

The silicon dioxide film may include halogen atoms.

The method may further include forming a recess through etching of the substrate on at least one side of the gate electrode after forming the gate electrode, and forming an epitaxial film in the recess through epitaxial growth.

The method may further include forming a dummy gate electrode on the substrate before forming the silicon dioxide film, forming a recess through etching of the substrate on at least one side of the dummy gate electrode, forming an epitaxial film in the recess through epitaxial growth, forming an interlayer insulating film for exposing an upper surface of the dummy gate electrode on the substrate, and exposing the substrate through removing of the dummy gate electrode.

Embodiments are also directed to a semiconductor device including a substrate and a film formed on the substrate, the film being formed by reacting at least one precursor compound selected from the following chemical formulas (1), (2), and (3) with an oxygen-containing reaction gas:

  (1)

  (2)

  (3)

wherein, independently in the chemical formulas (1), (2), and (3), H is hydrogen, x is 0 to 3, Si is silicon, A is a halogen, y is 1 to 4, N is nitrogen, and $R^1$, $R^2$, $R^3$, and $R^5$ are each independently selected from the group of H, aryl, perhaloaryl, $C_{1-8}$ alkyl, and $C_{1-8}$ perhaloalkyl, and $R^4$ is aryl in which at least one hydrogen is replaced with a halogen or $C_{1-8}$ alkyl in which at least one hydrogen is replaced with a halogen, and the film is a silicon dioxide film in which dangling bonds of silicon atoms at an interface between the silicon dioxide film and the substrate are bonded to halogen.

An upper surface of the substrate may include $Si_3SiA$, where A is halogen.

The precursor compound may include at least one selected from the group of $Si(NMe_2)_3Cl$, $Si(NMeEt)_3Cl$, $Si(NEt_2)_3Cl$, $Si(NEt_2)_2Cl_2$, $Si(NMe_2)_2Cl_2$, and $Si(NMeEt)_2Cl_2$.

The semiconductor device may include a recess adjacent to the film, the recess being filled with an epitaxial film that exerts a compressive stress or a tensile stress on the film.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
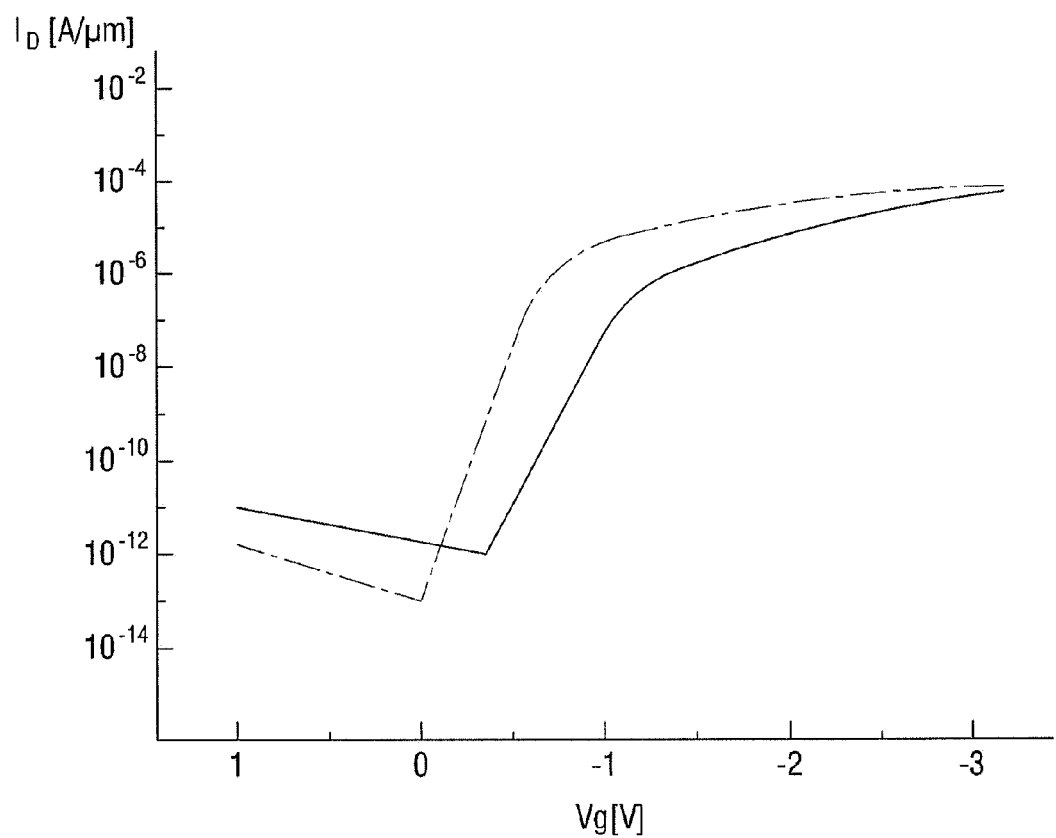
FIG. 1 illustrates a graph depicting negative bias temperature instability (NBTI) characteristics when stress is applied to a channel region

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Spatially relative terms, such as "lower," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

The use of the terms "a" and "an" and "the" and similar referents in the context of describing the embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings thereof.

Unless defined otherwise, all technical and scientific terms used herein have the same meaning as commonly understood by one of ordinary skill in the relevant art. It is noted that the use of any and all examples, or exemplary terms provided herein is intended merely to better illuminate and not limit the scope thereof unless otherwise specified. Further, unless defined otherwise, all terms defined in generally used dictionaries may not be overly interpreted.

The term "alkyl" refers to an aliphatic hydrocarbon group. The alkyl may be a "saturated alkyl" group that does not include any alkene or alkyne. The alkyl may also be an "unsaturated alkyl" group that includes at least one alkene or alkyne. The alkene refers to a group in which at least two carbon atoms are bound in at least one carbon-carbon double bond, and the alkyne refers to a group in which at least two carbon atoms are bound in at least one carbon-carbon triple bond.

The alkyl group may be substituted or unsubstituted. In the case where the alkyl group is substituted, the substituted group may be one or more groups individually and independently selected from the group of cycloalkyl, aryl, heteroaryl, heteroalicyclic, hydroxyl, alkoxy, aryloxy, mercapto, alkylthio, arylthio, cyano, halogen, carbonyl, thiocarbonyl, O-carbamyl, N-carbamyl, O-thiocarbamyl, N-thiocarbamyl, C-amido, N-amido, S-sulfonamido, N-sulfonamido, C-carboxy, O-carboxy, isocyanate, thiocyanate, isothiocyanate, nitro, silyl, trihalomethanesulfonyl, amino including mono- and di-substituted amino groups, and their protective derivatives. A typical alkyl group may be methyl, ethyl, propyl, isopropyl, butyl, isobutyl, tertiary butyl, pentyl, hexyl, ethenyl, propenyl, butenyl, cyclopropyl, cyclobutyl, cyclopentyl, cyclohexyl, or the like.

The term "aryl" refers to an aryl group including a carbocyclic aryl (e.g., phenyl) having at least one ring having a covalent pi electron system or a heterocyclic aryl group (e.g., pyridine). This term includes monocyclic or fused ring polycyclic (i.e., rings sharing adjacent pairs of carbon atoms) groups.

The term "perhaloalkyl" refers to an alkyl group in which all hydrogen atoms have been substituted with halogen atoms.

The term "perhaloaryl" may refer to an aryl group in which all hydrogen atoms have been substituted with halogen atoms.

The term "halogen" used in the specification may refer to elements in Group 17 (7A) of the periodic table, i.e., fluorine (F), chlorine (Cl), bromine (Br), iodine (I), and the like.

Embodiments relate to a composition for forming a silicon dioxide film on a substrate. In an implementation, a precursor composition for deposition of a silicon dioxide film according to embodiments may include a compound having a structure represented by the following chemical formula (1).

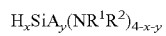 (1)

In the above chemical formula (1), H is hydrogen, x may be 0 to 3, Si is silicon, A may be a halogen atom, y may be 1 to 4, N is nitrogen, and $R^1$ and $R^2$ may be each independently selected from the group of H, aryl, perhaloaryl, $C_{1-8}$ alkyl, and $C_{1-8}$ perhaloalkyl.

Here, $R^1$ and $R^2$ may be methyl or ethyl. For example, $R^1$ and $R^2$ may be methyl, $R^1$ and $R^2$ may be ethyl, or $R^1$ may be methyl and $R^2$ may be ethyl.

If x is 0 and A is Cl, a precursor composition for deposition of a silicon dioxide film may include at least one selected from the group of $Si(NMe_2)_3Cl$, $Si(NMeEt)_3Cl$, $Si(NEt_2)_3Cl$, $Si(NEt_2)_2Cl_2$, $Si(NMe_2)_2Cl_2$, and $Si(NMeEt)_2Cl_2$.

In another implementation, a precursor composition for deposition of a silicon dioxide film may include a compound having a structure represented by the following chemical formula (2).

$$H_xSi(NAR^3)_{4-x} \quad (2)$$

In the above chemical formula (2), H is hydrogen, x may be 0 to 3, Si is silicon, A may be a halogen atom, N is nitrogen, and $R^3$ may be selected from the group of H, aryl, perhaloaryl, $C_{1-8}$ alkyl, and $C_{1-8}$ perhaloalkyl.

Here, $R^3$ may be methyl or ethyl.

Further, in still another implementation, a precursor composition for deposition of a silicon dioxide film may include a compound having a structure represented by the following chemical formula (3).

$$H_xSi(R^4)_z(R^5)_{4-x-z} \quad (3)$$

In the above chemical formula, H is hydrogen, x may be 0 to 3, Si is silicon, $R^5$ may be selected from the group of H, aryl, perhaloaryl, $C_{1-8}$ alkyl, and $C_{1-8}$ perhaloalkyl, and $R^4$ may be an aryl group in which at least one hydrogen is replaced with a halogen or a $C_{1-8}$ alkyl group in which at least one hydrogen is replaced with a halogen. In an implementation, z may be 1 to 4.

Here, $R^4$ may be —$CH_2Cl$, —$CHClCH_3$, —$CH_2F$, or —$CHFCH_3$.

Referring to FIGS. 1 and 2A to 2C, effects of the precursor composition will be described.

Figure 2A:
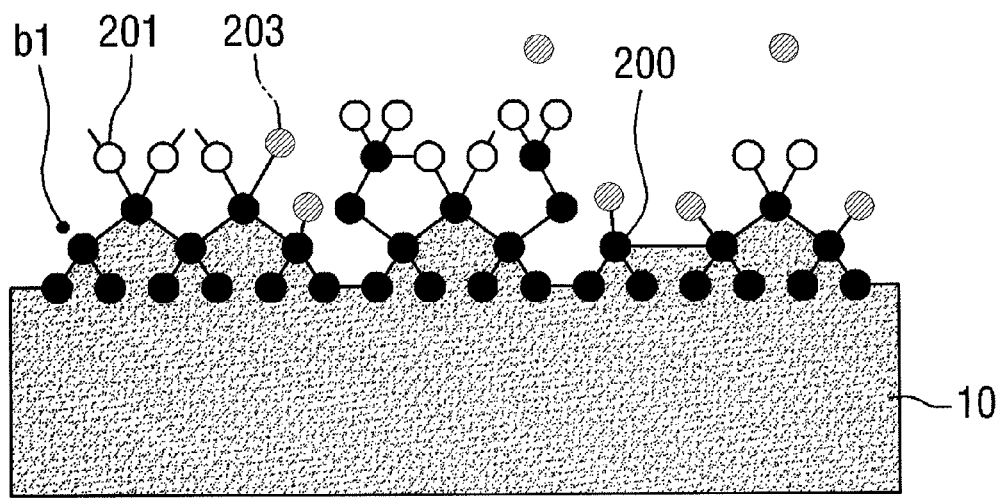
FIGS. 2A to 2C illustrate views explaining the effects of embodiments.
Figure 2B:
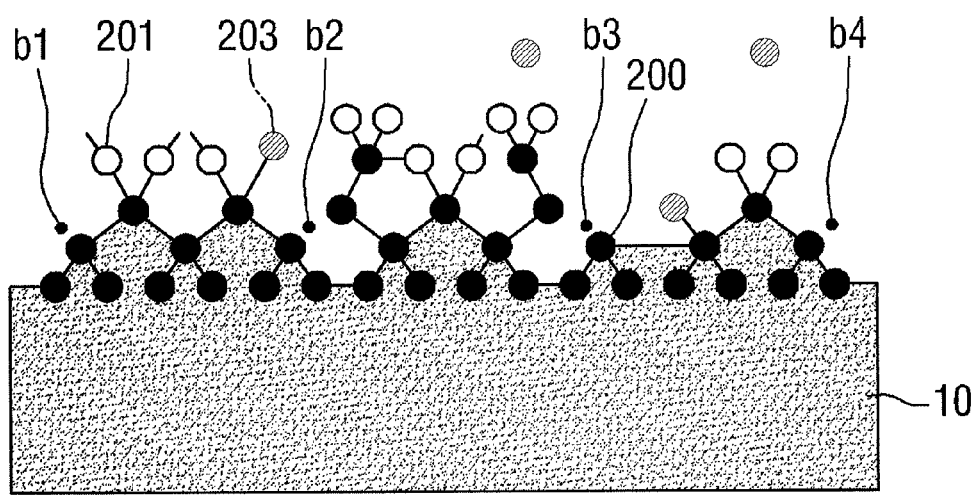
Figure 2C:
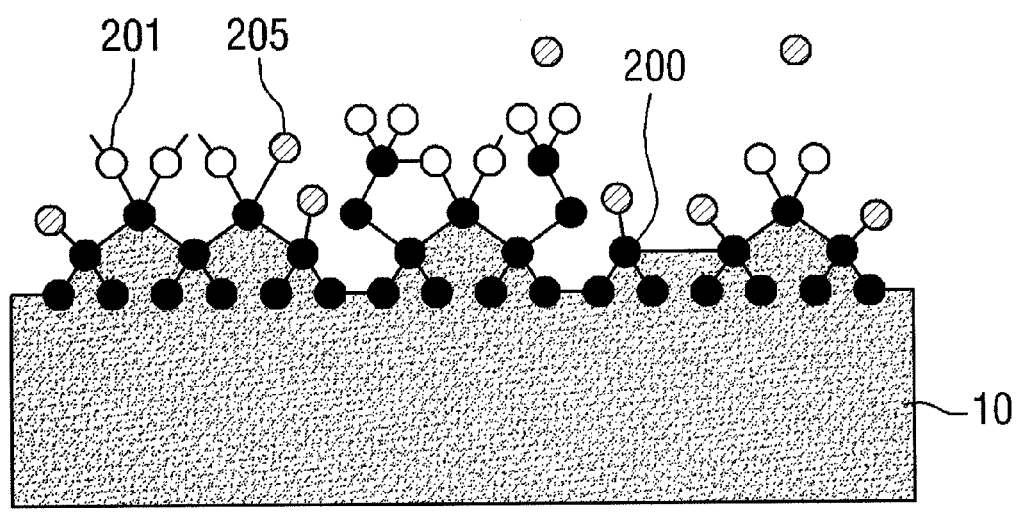

FIG. 1 illustrates a graph depicting NBTI characteristics when stress is applied to a channel region, and FIGS. 2A to 2C illustrate views explaining the effects of the use of the precursor composition.

Referring to FIG. 1, when stress is applied to a channel region of a transistor, it can be confirmed that the NBTI characteristics deteriorate. In the case where the stress is applied to the channel region, as compared with a case where the stress is not applied to the channel region, the size of current that flows to a drain at the same voltage is small, and the change of a slope of the current that flows to the drain is slow while the voltage that is applied to a gate is changed. The NBTI characteristics indicate that positive charge is trapped on the interface between the silicon dioxide film and the substrate while the device operates, and thus, the characteristics of the transistor deteriorate. This phenomenon mainly occurs in a PMOS transistor. An NBTI characteristic measuring experiment may be performed by measurement of the current that flows through the drain region when the size of a negative bias that is applied to the gate is changed. A dotted line in FIG. 1 represents the result when the stress is not applied to the channel region, and a solid line represents the result when the stress is applied to the channel region. The experiment shown in FIG. 1 was performed by applying a stress of 4.3 MVcm to the channel region at 250°.

As illustrated in FIG. 1, if the stress of 4.3 MVcm is applied to the channel region, the NBTI characteristics deteriorate, as compared with a case where the stress is not applied to the channel region. It is believed that this phenomenon occurs because Si—H bond that exists on the interface between the substrate and the silicon dioxide film is broken by the stress.

FIG. 2A illustrates a view depicting the interface between a substrate 10 and a silicon dioxide film when the stress is not applied to the channel region. Referring to FIG. 2A, the silicon dioxide film is deposited on the substrate 10. A silicon (Si) atom 200 that is included in the substrate 10 may be bonded with another silicon atom 200 or an oxygen (O) atom 201. Among the silicon atoms 200, a silicon atom 200 that is unable to be bonded with the oxygen atom 201 or another silicon atom 200, may exist. In this case, in order to prevent the silicon atom 200 from having a dangling bond, a hydrogen (H) atom 203 may be provided to the silicon atom 200. In this case, the hydrogen atom 203 may bond with the silicon atom 200 such that the dangling bond may no longer exist. Here, the hydrogen atom 203 may be included when the silicon dioxide film is formed (e.g., the reaction gas may include hydrogen) or may be injected into the silicon dioxide film to be bonded with the silicon atom 200 in a following process (e.g., ion injection process) after the silicon dioxide film is formed. However, the bond between a silicon atom 200 and a hydrogen atom 203 is not strong, and thus may be broken if even a small amount of energy is applied. FIG. 2B illustrates a view depicting the interface between the substrate 10 and the silicon dioxide film when the stress is applied to the channel region. Referring to FIG. 2B, the bond between silicon atoms 200 and hydrogen atoms 203 may be broken by the stress, thereby creating dangling bonds b1, b2, b3, and b4 in the silicon atoms 200. Due to the dangling bonds b1, b2, b3, and b4 occurring as described above, the threshold voltage of the transistor may be shifted, and the NBTI characteristics may deteriorate.

If the precursor composition for deposition of the silicon dioxide film includes a halogen atom 205, according to embodiments, when the silicon dioxide film is deposited on the substrate 10, as shown in FIG. 2C, the halogen atoms 205 may bond with the dangling bond of the silicon atoms 200. FIG. 2C illustrates a view depicting the interface between the substrate 100 and the silicon dioxide film when the silicon dioxide film is formed on the substrate 10 using the precursor composition for deposition of the silicon dioxide film according to embodiments. The interface between the silicon dioxide film and the substrate 10 may include Si-A (A is a halogen atom) bond instead Si—H bonds. The binding energy of an Si-A bond is much higher and more stable than that of a Si—H bond, and thus, the Si-A bond may be maintained without being broken even if the stress is applied to the channel region. Accordingly, if the silicon atoms 200 do not have dangling bonds, a shift in the threshold voltage and a deterioration of the NBTI characteristics may be reduced or prevented.

The magnitude of the binding energy of Si—H, Si—F and Si—Cl is shown in Table 1 below.

TABLE 1

| Bond | Si—H | Si—F | Si—Cl |
|---|---|---|---|
| Binding energy(eV) | 3.10 | 5.73 | 4.21 |

The halogen atom 205 may not be bonded with all of the dangling bonds included in the silicon atoms 200 of the substrate 10 when the silicon dioxide film is deposited on the substrate 10, and some dangling bonds may exist. However, the remaining dangling bonds may be bonded with the halogen atoms 205 remaining in the silicon dioxide film in a following semiconductor device fabricating process. For example, an annealing process may be performed on the substrate 10 after the silicon dioxide film is deposited on the substrate 10, and at this time, the halogen atom 205 may be bonded with the dangling bond of the silicon atom 200. Accordingly, the dangling bond may be eliminated from the interface between the substrate 10 and the silicon dioxide film.

Further, even if the stress is not applied to the channel region, the Si—H bond itself of the substrate 10 may deteriorate the NBTI characteristics. This is because the Si—H binding energy is low, and H is liable to come off. As a result, H may be separated with the lapse of time, and thus the number of dangling bonds of Si may be increased. If the halogen atom having high binding energy is bonded with Si on the upper surface of the substrate 10, the NBTI characteristics are less likely to deteriorate, even as time goes by.

Referring to FIGS. 3 to 8, a method for fabricating a semiconductor device according to an embodiment will be described.

FIGS. 3 to 8 illustrate views of intermediate stages depicting a method for fabricating a semiconductor device according to an embodiment.

Figure 3:
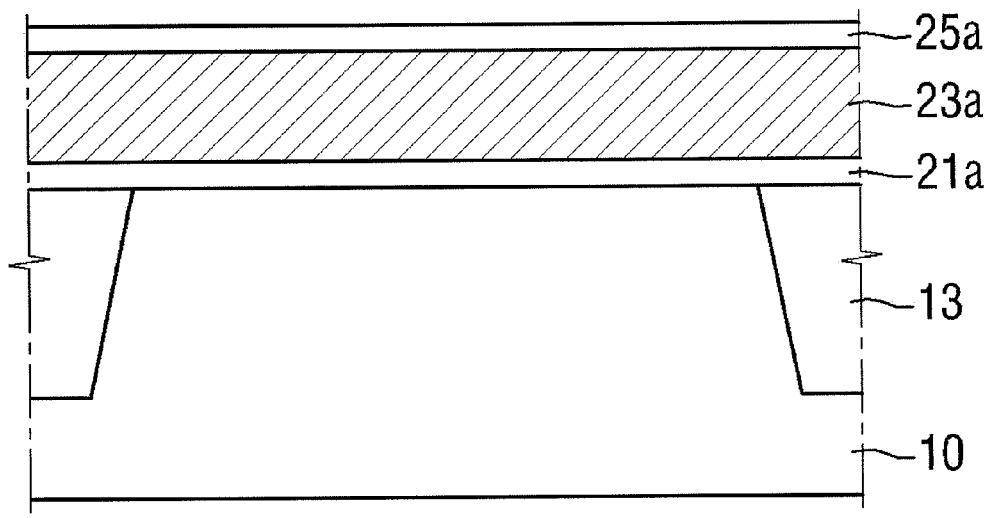
FIGS. 3 to 8 illustrate views of intermediate stages depicting a method for fabricating a semiconductor device according to an embodiment.

Referring to FIG. 3, a silicon dioxide film 21a, a gate electrode 23a, and a gate mask film 25a are sequentially stacked on a substrate 10.

The substrate 10 may be made of at least one semiconductor material selected from the group of, for example, Si, SiGe, SiC, and SiGeC.

An isolation region 13 for defining an active region is formed on the substrate 10. The isolation region 13 may be made of, for example, an STI (Shallow Trench Isolation) oxide or a FOX (Field Oxide) oxide.

The substrate 10 may include a PMOS region. For example, a PMOS transistor may be formed on the substrate 10. In other implementations, the substrate 10 may include an NMOS region.

The silicon dioxide film 21a may be formed on the substrate 10. The silicon dioxide film 21a may be deposited on the substrate 10 using ALD (Atomic Layer Deposition) or CVD (Chemical Vapor Deposition). In order to accurately form the silicon dioxide film 21a with a desired thickness and to improve the performance of the transistor, the ALD process or the CVD process may be used. In order to form the silicon dioxide film 21a through the ALD process or the CVD process, a precursor composition and a reaction gas may be used. The above-described precursor composition for deposition of the silicon dioxide film is used as the precursor composition, and a gas including oxygen atoms may be used as the reaction gas. The reaction gas may include, for example, at least one of $O_3$ gas, $O_2$ gas, $O_3$ plasma, and $O_2$ plasma.

The ALD process may include a repeated sequence of injecting the precursor composition for deposition of the silicon dioxide film, purging, injecting the reaction gas, and purging, per one period.

When the silicon dioxide film 21a is formed, the halogen atoms included in the precursor composition for deposition of the silicon dioxide film may be bonded with the silicon atoms on the upper surface of the substrate 10 to form $Si_3SiA$ (here, A is halogen). Further, the halogen atoms may remain in the silicon dioxide film 21a, and the additional halogen atom may be bonded with the silicon atoms on the upper surface of the substrate 10 in a following semiconductor device fabricating process. As a result, the silicon atoms that exist on the interface between the silicon dioxide film 21a and the substrate 10 may not include a dangling bond, and the silicon atoms may be bonded with the halogen atoms.

Then, the gate electrode 23a may be formed on the silicon dioxide film 21a. The gate electrode 23a may be poly-Si, poly-SiGe, poly-Si doped with impurities, metal, such as Ta, TaN, TaSiN, TiN, Mo, Ru, Ni, and NiSi, a single film such as metal silicide, or a stacked film combining the above materials, as examples.

The gate mask film 25a may be formed on the gate electrode 23a. The gate electrode 23a may include silicon dioxide or silicon nitride, as examples. The gate electrode 23a may be protected by the gate mask film 25a.

Figure 4:
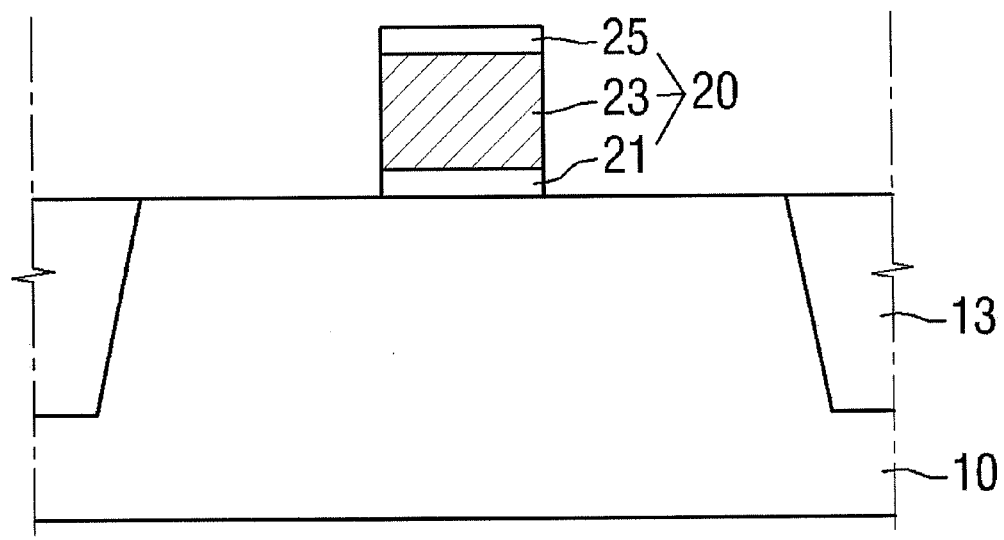

Referring to FIG. 4, a gate 20 may be formed through patterning of the silicon dioxide film 21a, the gate electrode 23a, and the gate mask film 25a.

Figure 5:
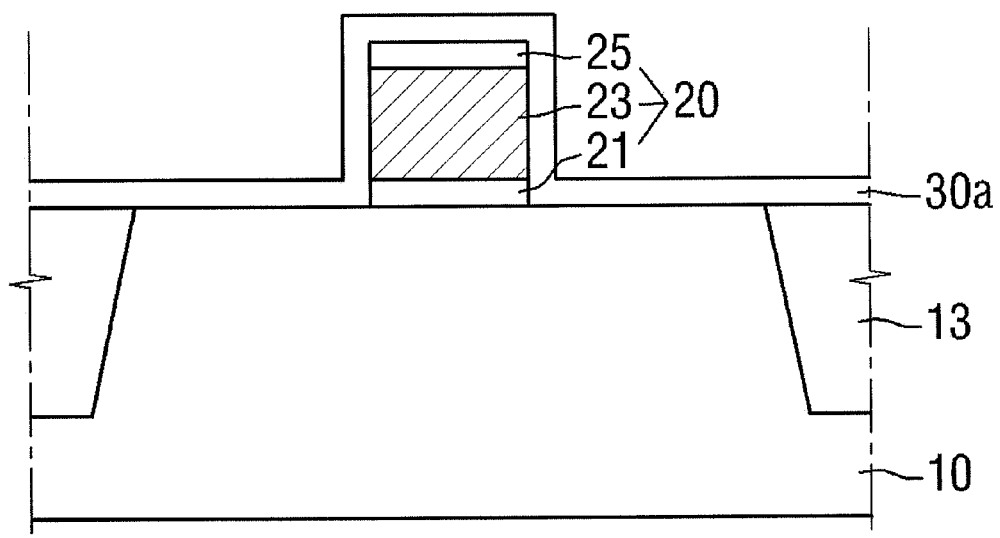

Referring to FIG. 5, a gate spacer film 30a may be formed on the substrate 10. The gate spacer film 30a may be conformally formed along the upper surface of the substrate 10, a side surface of the gate 20, and an upper surface of the gate 20. The gate spacer film 30a may include, for example, a silicon nitride film.

Figure 6:
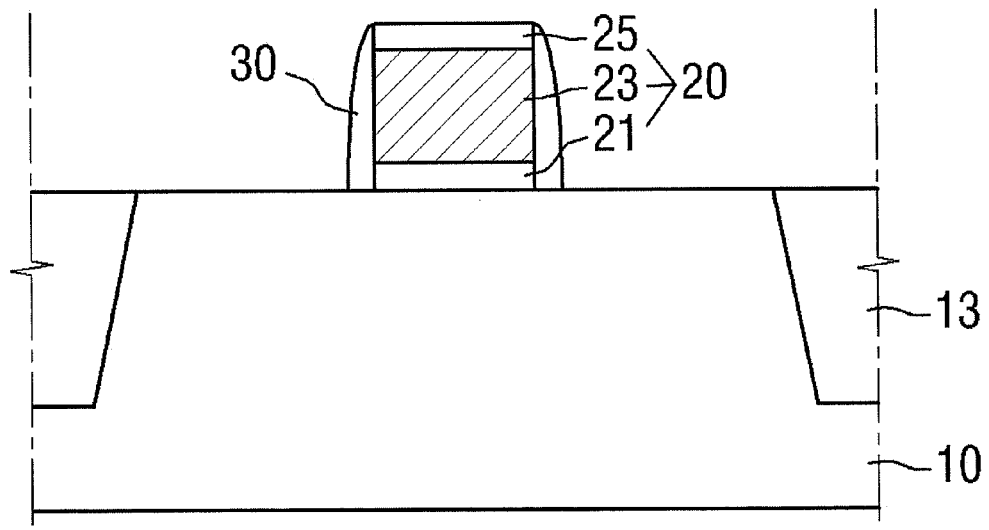

Referring to FIG. 6, a gate spacer 30 may be formed on the side surface of the gate 20 by removing the gate spacer film 30a on the upper surface of the substrate 10 and on the upper surface of the gate 20. In order to form the gate spacer 30, an etch back process may be used, as an example.

Figure 7:
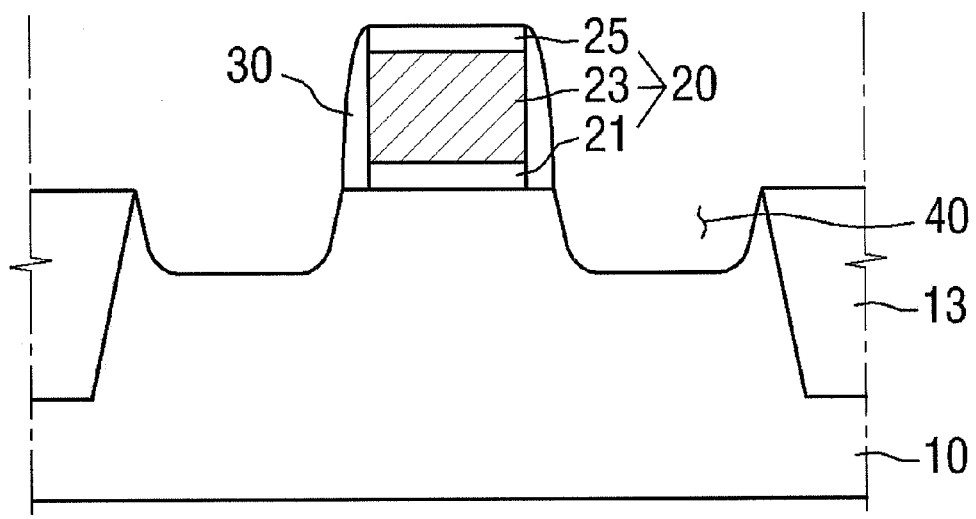
Figure 8:
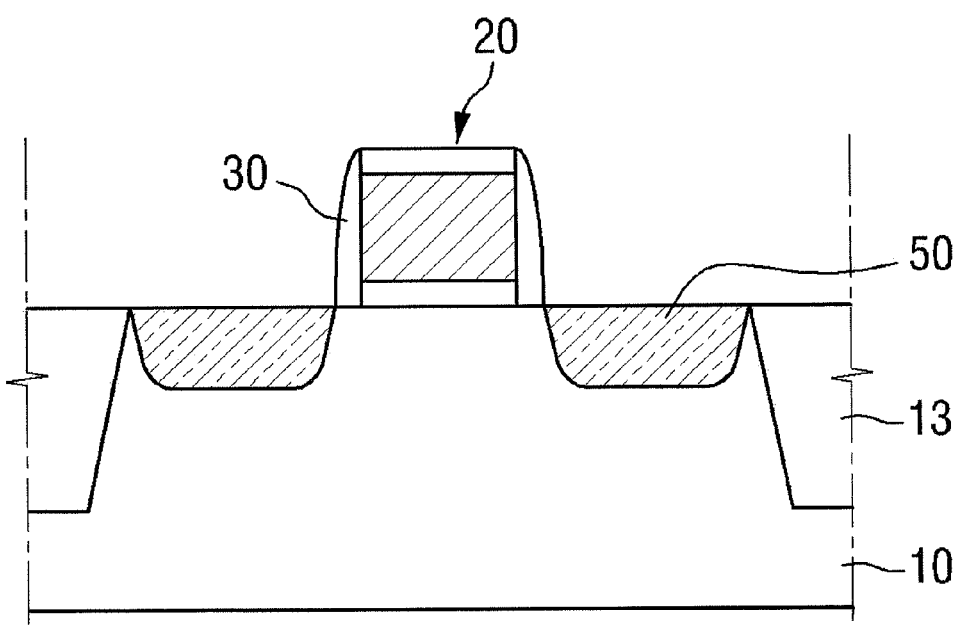

Referring to FIG. 7, a recess 40 may be formed on at least one side of the gate 20 through etching of the substrate 10. Then, as shown in FIG. 8, an epitaxial film 50 may be formed in the recess 40. The epitaxial film 50 may be formed through epitaxial growth. The epitaxial film 50 may be a source/drain region. For example, in FIG. 8, the epitaxial film 50 formed on the right side of the gate 20 may be the source region, and the epitaxial film 50 formed on the left side of the gate 20 may be the drain region. If the substrate 10 is the PMOS region, the epitaxial film 50 may include a compression stress material. The compression stress material may be a material having a larger lattice constant than that of Si, and may be, for example, SiGe. The compression stress material may apply a compression stress to the substrate 10 between the epitaxial films 50, for example, the channel region, to improve mobility of carriers in the channel region. Even if the stress is applied to the channel region, the bonding of silicon atoms that exist on the interface between the silicon dioxide film 21 and the substrate 10 with the halogen atoms included in the precursor composition may prevent or reduce the occurrence of the dangling bonds.

On the other hand, if the substrate 10 is an NMOS region, the epitaxial film 50 may include the same material as the substrate 10 or may include a tensile stress material. For example, if the substrate includes Si, the epitaxial film 50 may include a material (e.g., SiC) having a smaller lattice constant than that of Si.

Referring to FIGS. 9 to 16, a method for fabricating a semiconductor device according to another embodiment will be described. Explanation of the contents duplicate to those as described above will not be repeated.

FIGS. 9 to 16 illustrate views of intermediate stages depicting a method for fabricating a semiconductor device according to another embodiment.

Figure 9:
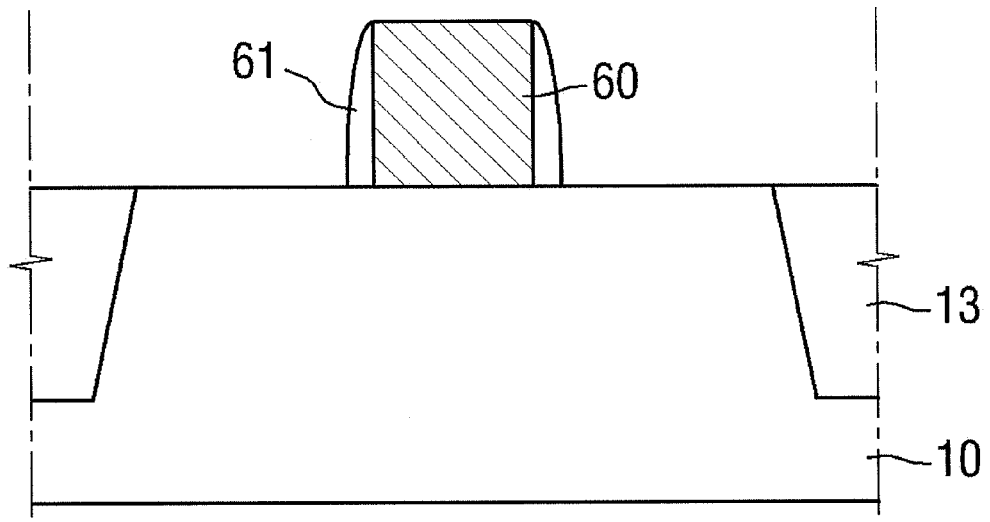
FIGS. 9 to 16 illustrate views of intermediate stages depicting a method for fabricating a semiconductor device according to another embodiment.

Referring to FIG. 9, a dummy gate electrode 60 and a gate spacer 61 are formed on the substrate 10. The substrate 10 may include an isolation region 13. The gate spacer 61 may be formed on at least one of both side surfaces of the dummy gate electrode 60.

Figure 10:
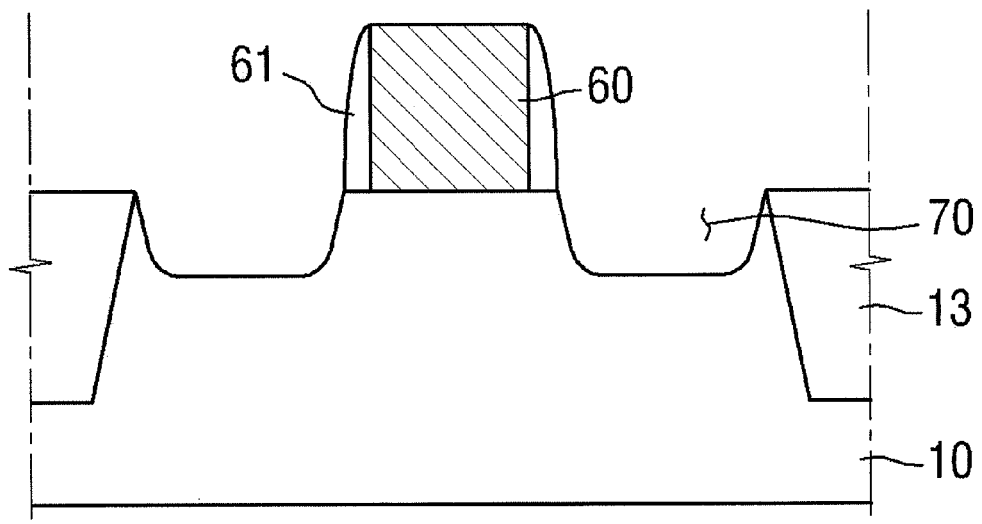
Figure 11:
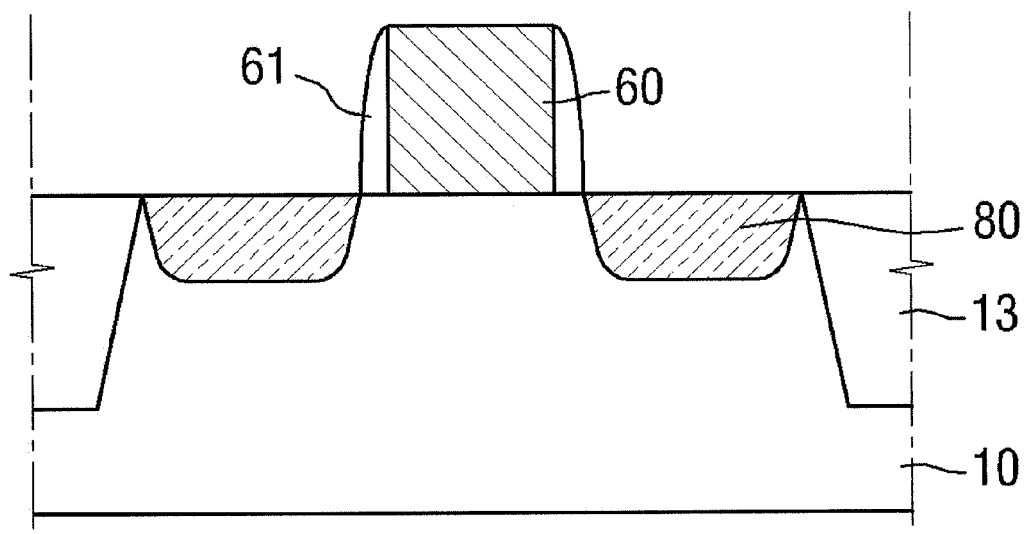

Referring to FIG. 10, a recess 70 may be formed on at least one side of the dummy gate electrode 60 through etching of the substrate 10. As shown in FIG. 11, an epitaxial film 80 may be formed in the recess 70 through epitaxial growth. The epitaxial film 80 may be a source/drain region, and a stress may be applied to the channel region through the epitaxial film 80.

Figure 12:
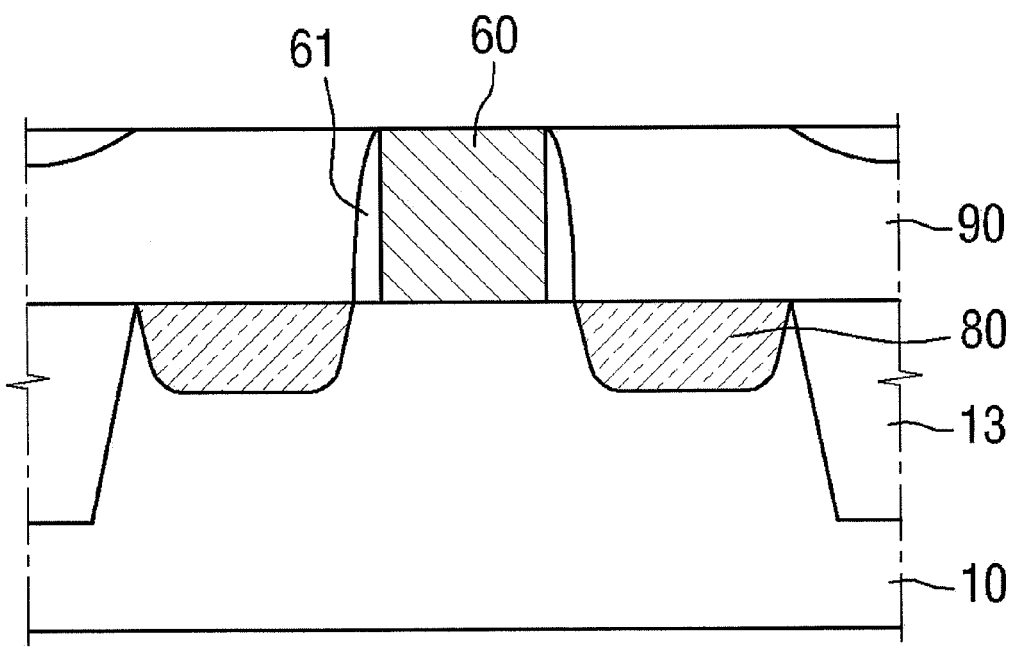
Figure 13:
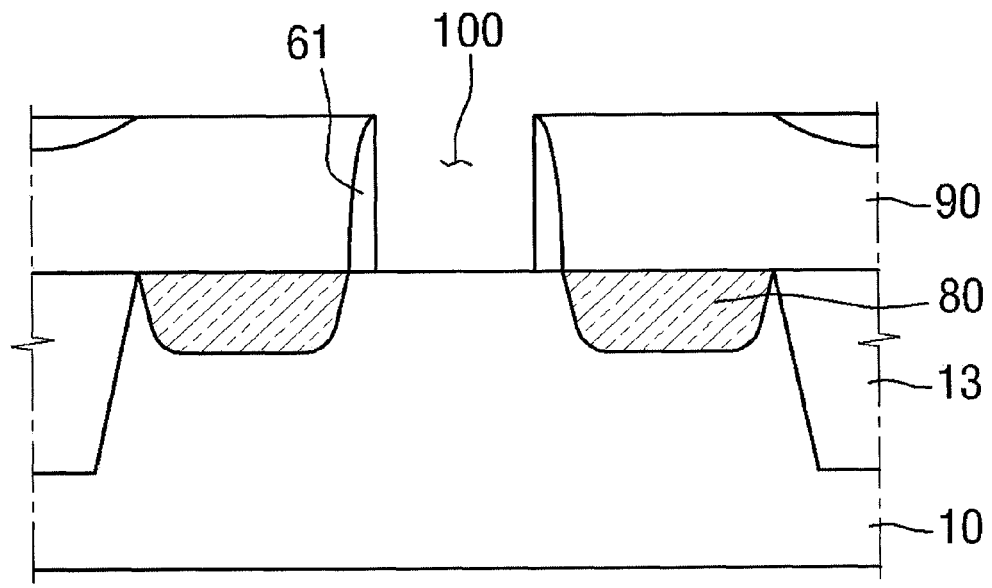

Referring to FIG. 12, an interlayer insulating film 90 may be formed on the substrate 10. The interlayer insulating film 90 may surround the dummy gate electrode 60 and the gate spacer 61, and may expose an upper surface of the dummy gate electrode 60. In order to form the interlayer insulating film 90 having a shape as shown in FIG. 12, for example, the interlayer insulating film 90 that covers the dummy gate electrode 60 may be formed on the substrate 10, and the upper surface of the dummy gate electrode 60 may be exposed through a CMP (Chemical Mechanical Polishing) process. Referring to FIG. 13, the dummy gate electrode 60 may be removed. A trench 100 may be formed by removing the dummy gate electrode 60. In the trench 100, the upper surface of the substrate 10 may be exposed.

Figure 14:
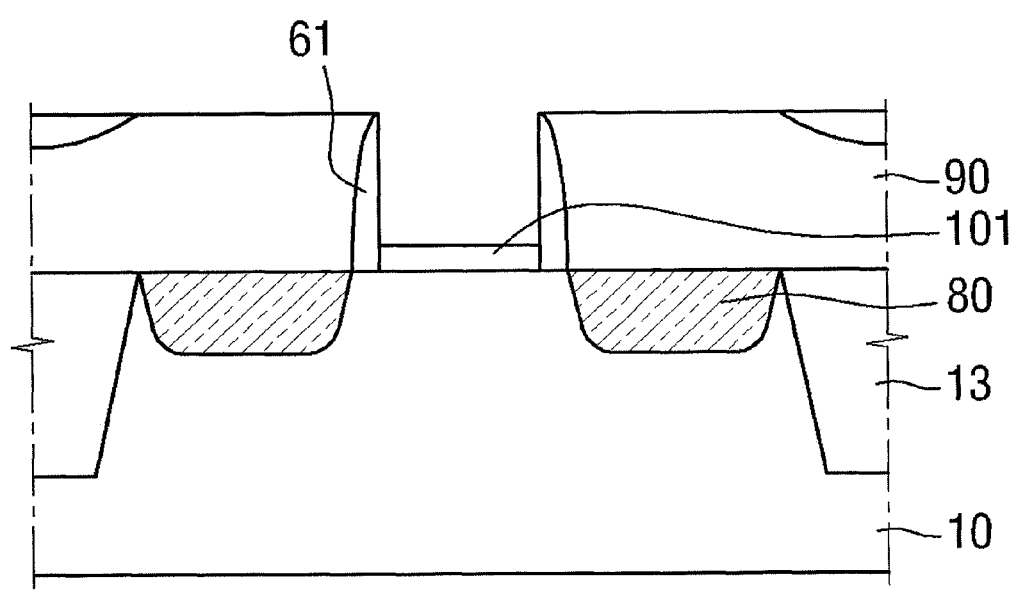

Referring to FIG. 14, a silicon dioxide film 101 may be formed on the upper surface of the substrate 10 in the trench 100.

The silicon dioxide film 101 may be formed along a bottom surface of the trench 100. The silicon dioxide film 101 may serve to prevent an inferior interface between the substrate 100 and the gate insulating film 103a. The silicon dioxide film 101 may be formed through deposition on the upper surface of the substrate 10 through an ALD process or a CVD process. In applying the ALD process or the CVD process, a precursor composition for deposition of the silicon dioxide film and a reaction gas may be used. As described above, the precursor composition for deposition of the silicon dioxide film may include a halogen, and the reaction gas may include at least one of $O_3$ gas, $O_2$ gas, $O_3$ plasma, and $O_2$ plasma.

The halogen included in the precursor composition for deposition of the silicon dioxide film may be bonded with Si on the upper surface of the substrate 10 to form $Si_3SiA$ when the silicon dioxide film 101 is formed, or the halogen may partially remain in the silicon dioxide film 101 to bond with dangling bonds of Si that remain in a following semiconductor device fabricating process.

Figure 15:
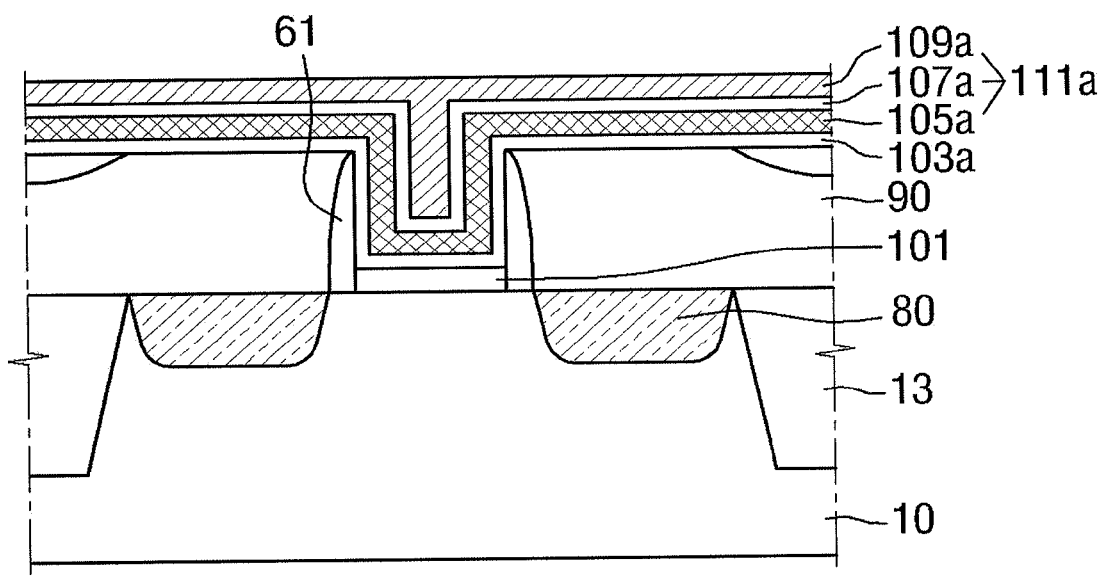

Then, referring to FIG. 15, a gate insulating film 103a and a gate electrode 111a may be sequentially formed on the silicon dioxide film 101.

The gate insulating film 103a may include a high-k material having a larger dielectric constant than that of the silicon dioxide film 101. For example, the gate insulating film 103a may include a material selected from the group of HfSiON, $HfO_2$, $ZrO_2$, $Ta_2O_5$, $TiO_2$, $SrTiO_3$, and $(Ba, Sr)TiO_3$. The gate insulating film 103a may be formed with an appropriate thickness depending on the kind of device to be formed.

The gate electrode 111a may include a first conduction type work function adjustment film 105a, a second conduction type work function adjustment film 107a, and a gate metal structure 109a. The first conduction type work function adjustment film 105a may be conformally formed. If the substrate 10 includes a PMOS region, the first conduction type work function adjustment film 105a may serve to adjust the operating characteristics of a P-type transistor through adjustment of the work function of the transistor. The first conduction type work function adjustment film 105a may include, for example, at least one of Mo, Pd, Ru, Pt, TiN, WN, TaN, Ir, TaC, RuN, and MoN.

The second conduction type work function adjustment film 107a may be formed on the first conduction type work function adjustment film 105a. The second conduction type may be different from the first conduction type, and the second conduction type may be an N-type. The second conduction type work function adjustment film 107a may serve to adjust the operating characteristics of an N-type transistor through adjustment of the work function of the transistor. The second conduction type work function adjustment film 107a may include, for example, TiAl or TiAlN. If the first conduction type work function adjustment film 105a were to be present on a lower portion of the second conduction type work function adjustment film 107a, although the second conduction type work function adjustment film 107a is formed on the first conduction type work function adjustment film 105a, the first conduction type work function adjustment film 105 may exert an influence on the operating characteristics of the transistor, but the second conduction type work function adjustment film 107a may be unable to exert an influence on the operating characteristics of the transistor. As a result, only the first conduction type work function adjustment film 105a may be able to adjust the operating characteristics of the transistor.

On the other hand, as illustrated in FIG. 15, the gate electrode 111a may include both the first and second conduction type work function adjustment films 105a and 107a. However, in other implementations, the gate electrode 111a may include only the first conduction type work function adjustment film 105a.

The gate metal structure 109a may be formed on the second conduction type work function adjustment film 107a. The gate metal structure 109a may include, for example, Al or W.

On the other hand, if the substrate 10 includes an NMOS region, the gate electrode 111a does not include the first conduction type work function adjustment film 105a. Accordingly, by the second conduction type work function adjustment film 107a, the gate electrode (111 of FIG. 16) may operate with the characteristics of an N-type transistor.

Figure 16:
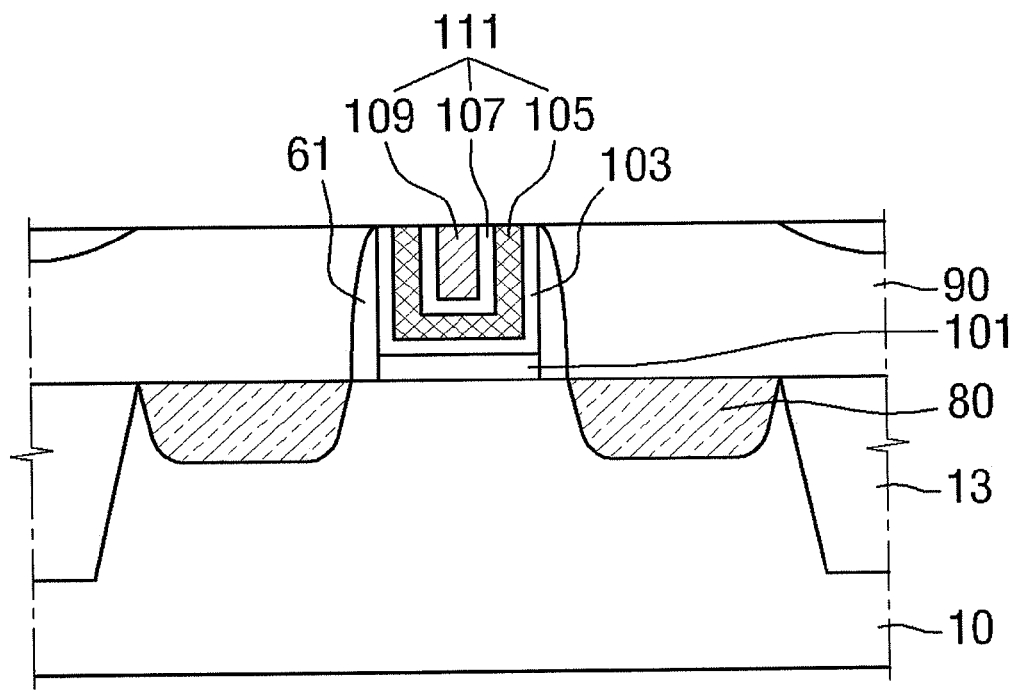

Then, referring to FIG. 16, the gate electrode 111 is formed by etching until the upper surface of the interlayer insulating film 90 is exposed.

Figure 17:
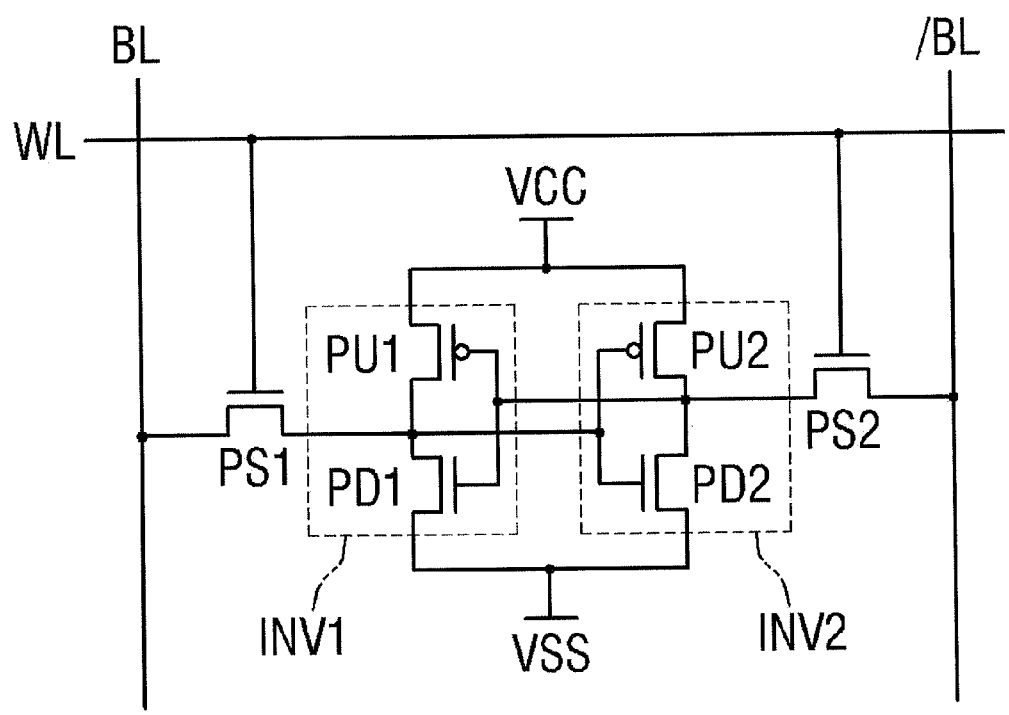
FIGS. 17 and 18 illustrate a circuit diagram and a layout diagram depicting a semiconductor device fabricated by the method for fabricating the semiconductor device according to embodiments.
Figure 18:
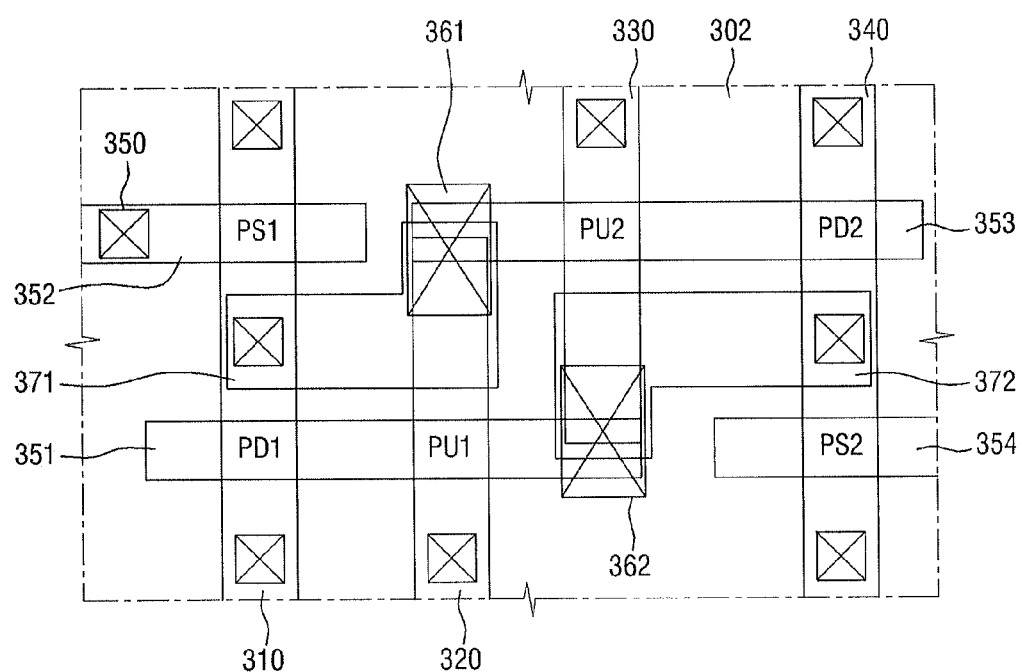

FIGS. 17 and 18 illustrate a circuit diagram and a layout diagram depicting a semiconductor device fabricated by the method for fabricating the semiconductor device according to embodiments.

Referring to FIGS. 17 and 18, a semiconductor device that is fabricated by the method for fabricating the semiconductor device according to embodiments may include a pair of inverters INV1 and INV2 connected in parallel between a power supply node Vcc and a ground node Vss, a first path transistor PS1 and a second pass transistor PS2 connected to output nodes of the respective inverters INV1 and INV2. The first pass transistor PS1 and the second pass transistor PS2 may be connected to a bit line BL and a complementary bit line /BL, respectively. Gates of the first pass transistor PS1 and the second pass transistor PS2 may be connected to a word line WL.

The first inverter INV1 may include a first pull-up transistor PU1 and a first pull-down transistor PD1 that are connected in series, and the second inverter INV2 may include a second pull-up transistor PU2 and a second pull-down transistor PD2 that are connected in series. The first pull-up transistor PU1 and the second pull-up transistor PU2 may be PMOS transistors, and the first pull-down transistor PD1 and the second pull-down transistor PD2 may be NMOS transistors.

Further, the first inverter INV1 and the second inverter INV2 may constitute one latch circuit in a manner that an input node of the first inverter INV1 is connected to an output node of the second inverter INV2, and an input node of the second inverter INV2 is connected to an output node of the first inverter INV1.

Referring to FIGS. 17 and 18, a first active region 310, a second active region 320, a third active region 330, and a fourth active region 340, which are spaced apart from each other, may be formed to extend long in one direction (for example, the upper/lower direction in FIG. 11). The extending length of the second active region 320 and the third active region 330 may be shorter than the extending length of the first active region 310 and the fourth active region 340.

Further, a first gate electrode 351, a second gate electrode 352, a third gate electrode 353, and a fourth gate electrode 354 may extend long in the another direction (for example, the right/left direction in FIG. 11), and may be formed to cross the first to fourth active regions 310 to 340. For example, the first gate electrode 351 may be formed to completely cross the first active region 310 and the second active region 320 and to overlap a part of a vertical end of the third active region 330. The third gate electrode 353 may be formed to completely cross the fourth active region 340 and the third active region 330 and to overlap a part of a vertical end of the second active region 320. The second gate electrode 352 and the fourth gate electrode 354 may be formed to cross the first active region 310 and the fourth active region 340, respectively.

As illustrated, the first pull-up transistor PU1 may be defined around a region where the first gate electrode 351 and the second active region 320 cross each other. The first pull-down transistor PD1 may be defined around a region where the first gate electrode 351 and the first active region 310 cross each other. The first pass transistor PS1 may be defined around a region where the second gate electrode 352 and the first active region 310 cross each other. The second pull-up transistor PU2 may be defined around a region where the third gate electrode 353 and the third active region 330 cross each other. The second pull-down transistor PD2 may be defined around a region where the third gate electrode 353 and the fourth active region 340 cross each other. The second pass transistor PS2 may be defined around a region where the fourth gate electrode 354 and the fourth active region 340 cross each other.

The source/drain may be formed on both sides of a region where the first to fourth gate electrodes 351 to 354 and the first to fourth active regions 310, 320, 330, and 340 cross each other.

Further, a plurality of contacts 350 may be formed.

In addition, a shared contact 361 may simultaneously connect the second active region 320, the third gate electrode 353, and a wiring 371 to each other. A shared contact 362 may simultaneously connect the third active region 330, the first gate electrode 351, and a wiring 372 to each other.

The first pull-up transistor PU1, the second pull-up transistor PU2, the first pull-down transistor PD1, the first pass transistor PS1, the second pull-down transistor PD2, and the second pass transistor PS2 may be transistors formed using the precursor composition for deposition of the silicon dioxide film according to embodiments.

Figure 19:
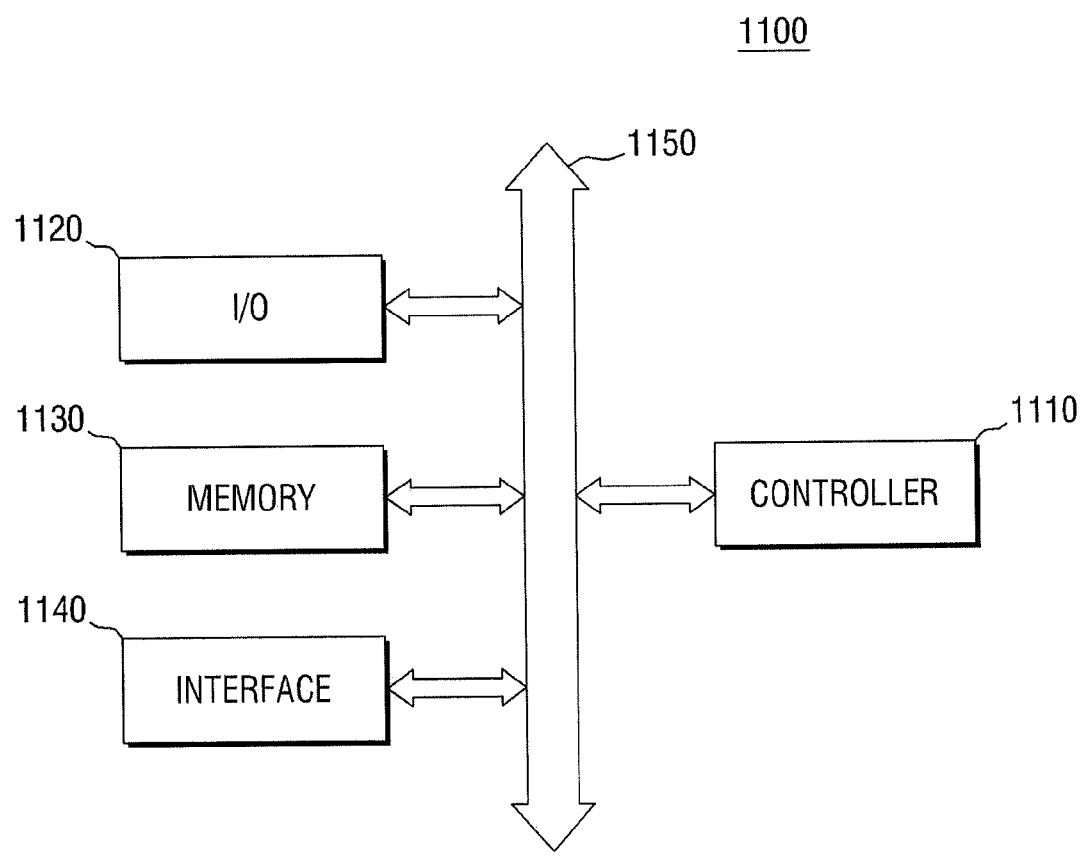
FIG. 19 illustrates a block diagram of an electronic system including a semiconductor device that is fabricated by the method for fabricating the semiconductor device according to embodiments.

FIG. 19 illustrates a block diagram of an electronic system including a semiconductor device that is fabricated by the method for fabricating the semiconductor device according to embodiments.

Referring to FIG. 19, an electronic system 1100 according to an embodiment may include a controller 1110, an input/output (I/O) device 1120, a memory 1130, an interface 1140, and a bus 1150. The controller 1110, the I/O device 1120, the memory 1130, and/or the interface 1140 may be coupled to one another through the bus 1150. The bus 1150 may correspond to paths through which data is transferred.

The controller 1110 may include at least one of a microprocessor, a digital signal processor, a microcontroller, and logic elements that may perform similar functions. The I/O device 1120 may include a keypad, a keyboard, and a display device. The memory 1130 may store data and/or commands. The interface 1140 may function to transfer the data to a communication network or receive the data from the communication network. The interface 1140 may be of a wired or wireless type. For example, the interface 1140 may include an antenna or a wire/wireless transceiver. The electronic system 1100 may further include a high-speed DRAM and/or SRAM as an operating memory for improving the operation of the controller 1110. A fin field-effect transistor according to embodiments may be provided inside the memory 1130 or may be provided as a part of the controller 1110 and the I/O device 1120.

The electronic system 1100 may be applied to a PDA (Personal Digital Assistant), a portable computer, a web tablet, a wireless phone, a mobile phone, a digital music player, a memory card, or all electronic devices that can transmit and/or receive information in wireless environments.

Figure 20:
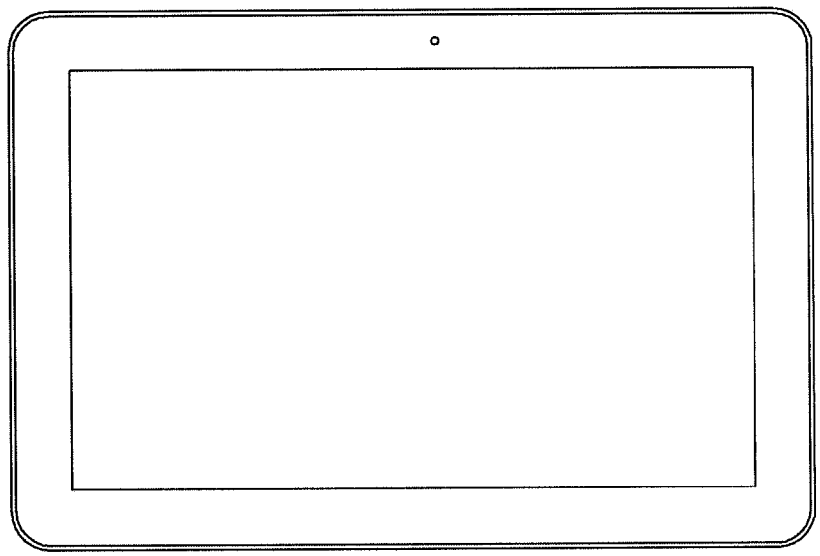
FIGS. 20 and 21 illustrate exemplary views of a semiconductor system to which the semiconductor device according to embodiments may be applied.
Figure 21:
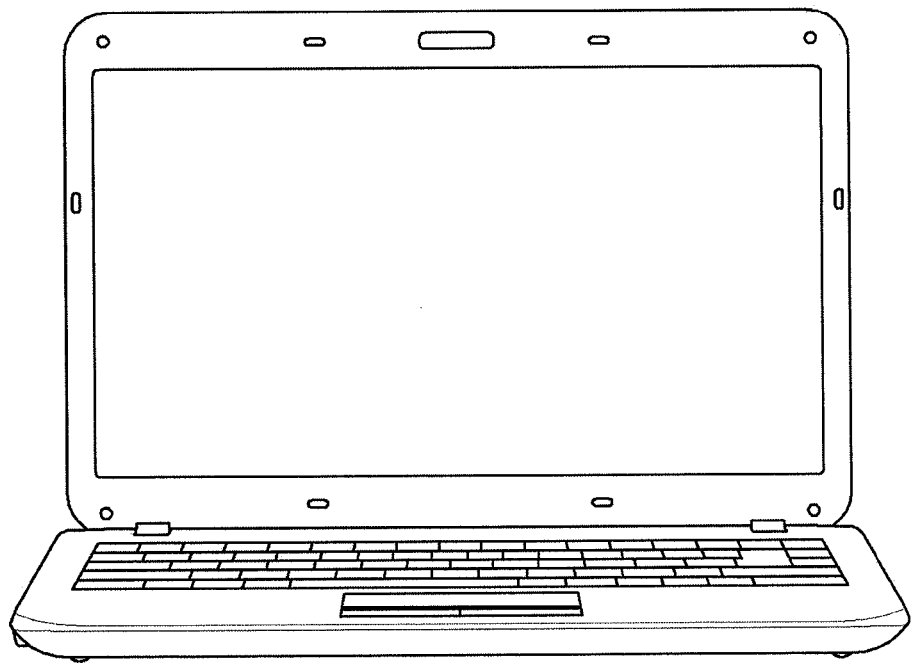

FIGS. 20 and 21 illustrate exemplary views of a semiconductor system to which the semiconductor device according to embodiments may be applied. FIG. 20 illustrates a tablet PC, and FIG. 21 illustrates a notebook PC. The semiconductor device fabricated according to embodiments may be used in the tablet PC or the notebook PC. It is apparent to those of skilled in the art that the semiconductor device according to embodiments may be applied to other integrated circuit devices.

By way of summation and review, various methods for improving driving current of a transistor have been developed. Among them, a method for improving the driving current through applying of stress to a channel portion of the transistor has been developed. However, due to such stress, NBTI (Negative Bias Temperature Instability) characteristics of a transistor may deteriorate. In particular, when stress is applied to a channel region of a transistor, for example, when a source/drain is epitaxially grown, a bond between silicon atoms and hydrogen atoms may be broken such that NBTI characteristics may deteriorate.

Embodiments provide a precursor composition for deposition of a silicon dioxide film that may prevent deterioration of NBTI characteristics of a transistor to improve reliability of a device. If a precursor composition for deposition of the silicon dioxide film includes a halogen atom when the silicon dioxide film is deposited on the substrate, according to embodiments, the halogen atom may bond with the dangling bond of a silicon atom. The binding energy of the Si-A (A is halogen atom) bond is much higher and more stable than that of the Si—H bond, and thus the Si-A bond may be maintained without being broken even if the stress is applied to the channel region.

Embodiments also provide a method for fabricating a semiconductor device that may prevent deterioration of NBTI characteristics of a transistor to improve reliability of a device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A precursor composition for forming a silicon dioxide film on a substrate, the precursor composition including at least one precursor compound represented by the following chemical formulas (1), (2), and (3):

$$H_xSiA_y(NR^1R^2)_{4-x-y} \quad (1)$$

$$H_xSi(NAR^3)_{4-x} \quad (2)$$

$$H_xSi(R^4)_z(R^5)_{4-x-z} \quad (3)$$

wherein, independently in the chemical formulas (1), (2), and (3), H is hydrogen, x is 0 in the chemical formula (1) and 0 to 3 in the chemical formulas (2) and (3), Si is silicon, A is a halogen, y is 1 to 4, z is 1 to 4, N is nitrogen, and $R^1$, $R^2$, $R^3$, and $R^5$ are each independently selected from the group of H, aryl, perhaloaryl, $C_{1-8}$ alkyl, and $C_{1-8}$ perhaloalkyl, and $R^4$ is aryl in which at least one hydrogen is replaced with a halogen or $C_{1-8}$ alkyl in which at least one hydrogen is replaced with a halogen, and wherein the precursor composition includes the precursor compound of formulas (2) and (3), and $R^3$ and $R^5$ are each independently methyl or ethyl.

2. The precursor composition as claimed in claim 1, wherein:
y is 1 to 3,
the precursor composition includes the precursor compound of formula (1), and
$R^1$ and $R^2$ are methyl.

3. The precursor composition as claimed in claim 1, wherein:
y is 1 to 3,
the precursor composition includes the precursor compound of formula (1), and
$R^1$ and $R^2$ are ethyl.

4. The precursor composition as claimed in claim 1, wherein:
y is 1 to 3,
the precursor composition includes the precursor compound of formula (1), and
$R^1$ is methyl and $R^2$ is ethyl.

5. The precursor composition as claimed in claim 1, wherein:
the precursor composition includes the precursor compound of formula (3), and
$R^4$ is —$CH_2Cl$, —$CHClCH_3$, —$CH_2F$, or —$CHFCH_3$.

6. The precursor composition as claimed in claim 1, wherein the precursor composition includes at least one selected from the group of $Si(NMe_2)_3Cl$, $Si(NMeEt)_3Cl$, $Si(NEt_2)_3Cl$, $Si(NEt_2)_2Cl_2$, $Si(NMe_2)_2Cl_2$, and $Si(NMeEt)_2Cl_2$.

7. A method for fabricating a semiconductor device, the method comprising:
forming a silicon dioxide film on a substrate; and
forming a gate electrode on the silicon dioxide film,
wherein the silicon dioxide film is formed using a precursor composition for deposition and a reaction gas, and
the precursor composition including at least one precursor compound represented by the following chemical formulas (1), (2), and (3):

$$H_xSiA_y(NR^1R^2)_{4-x-y} \quad (1)$$

$$H_xSi(NAR^3)_{4-x} \quad (2)$$

$$H_xSi(R^4)_z(R^5)_{4-x-z} \quad (3)$$

wherein, independently in the chemical formulas (1), (2), and (3), H is hydrogen, x is 0 in the chemical formula (1) and 0 to 3 in the chemical formulas (2) and (3), Si is silicon, A is halogen, y is 1 to 4, z is 1 to 4, N is nitrogen, and $R^1$, $R^2$, $R^3$, and $R^5$ are each independently selected from the group of H, aryl, perhaloaryl, $C_{1-8}$ alkyl, and $C_{1-8}$ perhaloalkyl, and $R^4$ is aryl in which at least one hydrogen is replaced with a halogen or $C_{1-8}$ alkyl in which at least one hydrogen is replaced with a halogen, and wherein the precursor composition includes the precursor compound of formulas (2) and (3), and $R^3$ and $R^5$ are each independently methyl or ethyl.

8. The method for fabricating a semiconductor device as claimed in claim 7, wherein:
the substrate includes a semiconductor material, and
an upper surface of the substrate includes $Si_3SiA$, where A is halogen.

9. The method for fabricating a semiconductor device as claimed in claim 7, wherein:
forming the silicon dioxide film includes forming the silicon dioxide film using ALD (Atomic Layer Deposition) or CVD (Chemical Vapor Deposition), and
the reaction gas includes at least one of $O_3$ gas, $O_2$ gas, $O_3$ plasma, and $O_2$ plasma.

10. The method for fabricating a semiconductor device as claimed in claim 7, wherein the silicon dioxide film includes halogen atoms.

11. The method for fabricating a semiconductor device as claimed in claim 7, further comprising:
forming a recess through etching of the substrate on at least one side of the gate electrode after forming the gate electrode; and
forming an epitaxial film in the recess through epitaxial growth.

12. The method for fabricating a semiconductor device as claimed in claim 7, further comprising:
forming a dummy gate electrode on the substrate before forming the silicon dioxide film;
forming a recess through etching of the substrate on at least one side of the dummy gate electrode;
forming an epitaxial film in the recess through epitaxial growth;
forming an interlayer insulating film for exposing an upper surface of the dummy gate electrode on the substrate; and
exposing the substrate through removing of the dummy gate electrode.

13. A semiconductor device, comprising:
a substrate; and
a film formed on the substrate the film being formed by reacting at least one precursor compound selected from the following chemical formulas (1), (2), and (3) with an oxygen-containing reaction gas:

$$H_xSiA_y(NR^1R^2)_{4-x-y} \quad (1)$$

$$H_xSi(NAR^3)_{4-x} \quad (2)$$

$$H_xSi(R^4)_z(R^5)_{4-x-z} \quad (3)$$

wherein, independently in the chemical formulas (1), (2), and (3), H is hydrogen, x is 0 in the chemical formula (1) and 0 to 3 in the chemical formulas (2) and (3), Si is silicon, A is a halogen, y is 1 to 4, z is 1 to 4, N is nitrogen, and $R^1$, $R^2$, $R^3$, and $R^5$ are each independently selected from the group of H, aryl, perhaloaryl, $C_{1-8}$ alkyl, and $C_{1-8}$ perhaloalkyl, and $R^4$ is aryl in which at least one hydrogen is replaced with a halogen or $C_{1-8}$ alkyl in which at least one hydrogen is replaced with a halogen, the film is a silicon dioxide film in which dangling bonds of silicon atoms at an interface between the silicon dioxide film and the substrate are bonded to halogen, the precursor composition includes the precursor compound of formulas (2) and (3), and $R^3$ and $R^5$ are each independently methyl or ethyl.

14. The semiconductor device as claimed in claim 13, wherein an upper surface of the substrate includes $Si_3SiA$, where A is halogen.

15. The semiconductor device as claimed in claim 13, wherein the precursor compound includes at least one selected from the group of $Si(NMe_2)_3Cl$, $Si(NMeEt)_3Cl$, $Si(NEt_2)_3Cl$, $Si(NEt_2)_2Cl_2$, $Si(NMe_2)_2Cl_2$, and $Si(NMeEt)_2Cl_2$.

16. The semiconductor device as claimed in claim 13, wherein the semiconductor device includes a recess adjacent to the film, the recess being filled with an epitaxial film that exerts a compressive stress or a tensile stress on the film.

17. The method for fabricating a semiconductor device as claimed in claim 7, wherein the precursor composition includes at least one selected from the group of $Si(NMe_2)_3Cl$, $Si(NMeEt)_3Cl$, $Si(NEt_2)_3Cl$, $Si(NEt_2)_2Cl_2$, $Si(NMe_2)_2Cl_2$, and $Si(NMeEt)_2Cl_2$.

* * * * *